United States Patent
Revankar et al.

(10) Patent No.: US 10,510,431 B2
(45) Date of Patent: Dec. 17, 2019

(54) DETECTING RANDOM TELEGRAPH NOISE DEFECTS IN MEMORY

(71) Applicant: QUALCOMM Incorporated, San Diego, CA (US)

(72) Inventors: Sneha Revankar, Bangalore (IN); Karthikeyan Subramanian, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 161 days.

(21) Appl. No.: 15/713,205

(22) Filed: Sep. 22, 2017

(65) Prior Publication Data

US 2019/0096504 A1 Mar. 28, 2019

(51) Int. Cl.
| | | |
|---|---|---|
| *G11C 29/44* | (2006.01) | |
| *G11C 29/36* | (2006.01) | |
| *G11C 29/10* | (2006.01) | |
| *G11C 29/04* | (2006.01) | |
| *G11C 29/50* | (2006.01) | |
| *G11C 29/06* | (2006.01) | |
| *G11C 29/38* | (2006.01) | |
| *G11C 16/34* | (2006.01) | |
| *G11C 29/00* | (2006.01) | |

(52) U.S. Cl.
CPC .............. *G11C 29/44* (2013.01); *G11C 29/04* (2013.01); *G11C 29/06* (2013.01); *G11C 29/10* (2013.01); *G11C 29/36* (2013.01); *G11C 29/38* (2013.01); *G11C 29/50016* (2013.01); *G11C 16/3427* (2013.01); *G11C 29/70* (2013.01); *G11C 2029/0409* (2013.01); *G11C 2029/3602* (2013.01); *G11C 2029/5002* (2013.01)

(58) Field of Classification Search
CPC ..... G11C 29/06; G11C 29/4401; G11C 29/10; G11C 29/24; G11C 29/44; G11C 29/72; G11C 29/38; G11C 29/70
See application file for complete search history.

(56) References Cited

U.S. PATENT DOCUMENTS 4,715,034 A * 12/1987 Jacobson ................ G11C 29/36
365/201
5,289,475 A 2/1994 Slemmer et al.
(Continued)

FOREIGN PATENT DOCUMENTS

JP 2012128915 A 7/2012

OTHER PUBLICATIONS

Ye et al, Simulation of random telegraph noise with 2-stage equivalent circuit, IEEE, pp. 709-713 (Year: 2010).*

(Continued)

*Primary Examiner* — Shelly A Chase
(74) *Attorney, Agent, or Firm* — Seyfarth Shaw LLP (57) ABSTRACT

A method of detecting random telegraph noise defects in a memory includes initializing a first bit cell of the memory to a first value and reading the first value from the first bit cell. The method also includes writing a second value to the first bit cell and performing back to back read operations on a second bit cell adjacent to the first bit cell, after writing the second value. The method further includes attempting to read the second value from the first bit cell and determining whether the first bit cell is defective based on whether the second value was read from the first bit cell.

21 Claims, 5 Drawing Sheets

(56) References Cited

U.S. PATENT DOCUMENTS

| | | | |
|---|---|---|---|
| 6,070,256 A * | 5/2000 | Wu | G11C 29/34 |
| | | | 365/201 |
| 6,563,751 B1 | 5/2003 | Wu | |
| 7,038,956 B2 | 5/2006 | Beer | |
| 7,370,251 B2 | 5/2008 | Nadeau-Dostie et al. | |
| 7,536,614 B1 * | 5/2009 | Ma | G11C 29/44 |
| | | | 365/200 |
| 8,850,277 B2 | 9/2014 | Amirkhanyan et al. | |
| 2006/0077734 A1 | 4/2006 | Fong | |
| 2009/0089631 A1 | 4/2009 | Kanamaru et al. | |
| 2010/0275074 A1 | 10/2010 | Nicolaidis et al. | |
| 2013/0258786 A1 | 10/2013 | Chakravarty, Sr. et al. | |
| 2017/0084351 A1 | 3/2017 | Querbach et al. | |

OTHER PUBLICATIONS

Michael B., "Software-Based Memory Testing", Embedded Systems Programming, Jul. 2000, 8 Pages.
International Search Report and Written Opinion—PCT/US2018/051992—ISA/EPO—dated Nov. 30, 2018.

* cited by examiner

DETECTING RANDOM TELEGRAPH NOISE DEFECTS IN MEMORY

TECHNICAL FIELD

Certain aspects of the present disclosure generally relate to memory testing, and more particularly to systems and methods for detecting random telegraph noise defects in memory.

BACKGROUND

In memory designs, such as dense memory designs, a weak memory bit cell may degrade over a period of time due to various defects, such as silicon defects. For example, a device, such as a modem, may crash on aging tests because of bad bit flips on a level two (L2) cache at high temperatures. Defects caused by a weak memory cell may result in an increased number of defective parts per million (DPPM).

Single bit failures in a memory may be the result of random telegraph noise (RTN). Over a period of time, the random telegraph noise may impact the read stability of bit cells. Memory built in self test (BIST) production vectors with substantial coverage, such as one hundred percent coverage, may not identify weak bit cells at room temperature or higher. Automatic test equipment (ATE) may reproduce the failures using central processing unit (CPU) functional testing at high temperatures. The test time (e.g., approximately four seconds) for automatic test equipment is not desirable during a production flow. There is a need for improved bit cell testing to detect weak memory bit cells to reduce the number of defective parts per million.

SUMMARY

In one aspect of the present disclosure, a method of detecting random telegraph noise defects in a memory is disclosed. The method includes initializing a first bit cell of the memory to a first value. The method also includes reading the first value from the first bit cell. The method further includes writing a second value to the first bit cell. The method further includes performing back to back read operations on a second bit cell adjacent to the first bit cell. The back to back reads are performed after writing the second value. The method still further includes attempting to read the second value from the first bit cell. The method further includes determining whether the first bit cell is defective based on whether the second value was read from the first bit cell.

Another aspect of the present disclosure is directed to an apparatus including means for initializing a first bit cell of a memory to a first value. The apparatus also includes means for reading the first value from the first bit cell. The apparatus further includes means for writing a second value to the first bit cell. The apparatus still further includes means for performing back to back read operations on a second bit cell adjacent to the first bit cell. The back to back reads are performed after writing the second value. The apparatus also includes means for attempting to read the second value from the first bit cell. The apparatus further includes means for determining whether the first bit cell is defective based on whether the second value was read from the first bit cell.

In another aspect of the present disclosure, a non-transitory computer-readable medium with program code recorded thereon is disclosed. The program code is for detecting random telegraph noise defects in a memory. The program code is executed by a processor and includes program code to initialize a first bit cell of the memory to a first value. The program code also includes program code to read the first value from the first bit cell. The program code further includes program code to write a second value to the first bit cell. The program code still further includes program code to perform back to back read operations on a second bit cell adjacent to the first bit cell. The back to back reads are performed after writing the second value. The program code also includes program code to attempt to read the second value from the first bit cell. The program code further includes program code to determine whether the first bit cell is defective based on whether the second value was read from the first bit cell.

Another aspect of the present disclosure is directed to an apparatus for detecting random telegraph noise defects in a memory. The apparatus includes the memory and one or more processors coupled to the memory. The processor(s) is configured to initialize a first bit cell of the memory to a first value. The processor(s) is also configured to read the first value from the first bit cell. The processor(s) is further configured to write a second value to the first bit cell. The processor(s) is still further configured to perform back to back read operations on a second bit cell adjacent to the first bit cell, The back to back reads are performed after writing the second value. The processor(s) is also configured to attempt to read the second value from the first bit cell. The processor(s) is further configured to determine whether the first bit cell is defective based on whether the second value was read from the first bit cell.

This has outlined, rather broadly, the features and technical advantages of the present disclosure in order that the detailed description that follows may be better understood. Additional features and advantages of the present disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the described concepts may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

According to aspects of the present disclosure, value tier devices are tested using an embedded test, such as an automatic test equipment screen, to improve the quality of memory used at the customer end. Automotive chips are a type of value tier device. A defect in an automotive chip may lead to a car accident. Therefore, it is desirable to prevent in-field memory failures for an automobile. Keeping automotive safety standards in mind, aspects of the present disclosure embed the testing in automotive chips. In one configuration, tests are executed at a pre-determined interval in the field. For example, the tests may be continuously executed. As another example, the tests may be performed when a device is initialized. Any memory aging related defects in the chip may be reported to the driver and/or manufacturer.

Random telegraph noise (RTN) may be caused by trapping and detrapping electrons in a gate dielectric. Trapping and detrapping electrons cause threshold voltage (Vt) variations over time, such that the random telegraph noise may be an aging defect. In some cases, the random telegraph noise is experienced when a chip size is reduced. For example, random telegraph noise may be experienced on chips that are fabricated at a 28 nm or lower process node. Random telegraph noise may be inversely related to size of the device (e.g., width×length) such that the random telegraph noise increases as a memory size decreases. Furthermore, random dopant fluctuations (RDF) are inversely related to size.

Random telegraph noise increases a read stability fail rate for memory, such as static random access memory (SRAM), over a cycle count. The impact on memory may include an increased read stability fail bit count (FBC) over a read cycle. The impact may also include an increased read stability Vccmin over a read cycle. Vccmin is the higher of the minimum voltage used to read data from the memory and write data to the memory. Finally, a static noise margin (SNM) may degrade over time due to an increased read stability fail rate.

Figure 1:
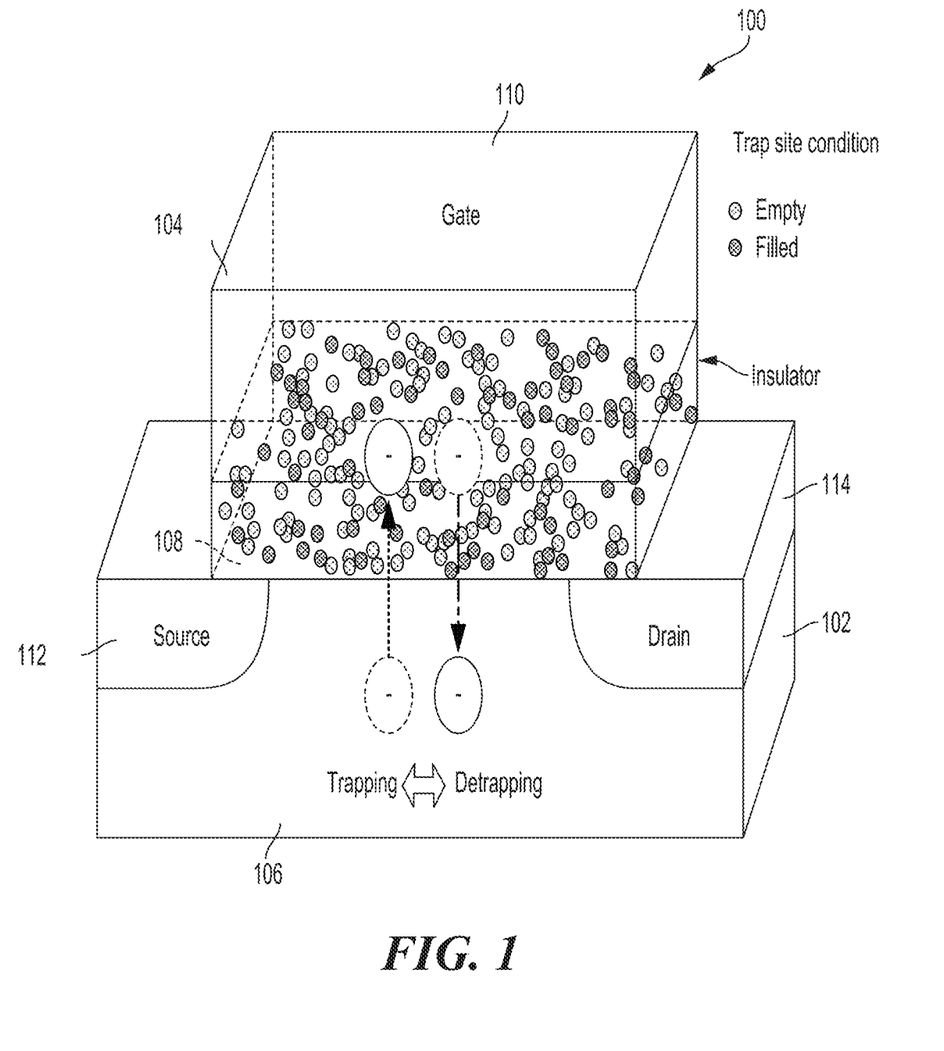
FIG. 1 illustrates a diagram of a transistor for use within a memory device according to aspects of the present disclosure.

FIG. 1 illustrates an example of a transistor 100 for use within a memory device according to aspects of the present disclosure. As shown in FIG. 1, the transistor 100 includes a semiconductor substrate 102 with a gate region 104 formed over a channel region 106 of the semiconductor substrate 102. The gate region 104 includes an insulator layer 108 of electron trapping material that operates as a charge storage center for the transistor 100. A gate 110 is connected on top of the insulator layer 108. The transistor 100 also includes a source 112 and a drain 114.

As seen in FIG. 1, filled electrons can be detrapped from the insulator layer 108 to the channel region 106. Empty electrons can be trapped from the channel region 106 to the insulator layer 108. Trapping and detrapping electrons may lead to random telegraph noise defects.

For testing of value tier devices, such as automotive chips and mobile chips, there are various approaches that may act as a screen for a memory bit flip failure. In some cases, CPU functional shmoo tests are executed across a wide voltage range in production flow. Shmoo tests may be overly extensive and increase the testing time. In other cases, the default memory built in self test high voltage (HV) screen specification is increased by 100 mV to detect weak memory devices. Increasing the built in self test high voltage screen specification may also be overly extensive and is not reliable for detecting weak memory bit cells.

In conventional systems, defects may be identified by increasing an operating voltage (e.g., highest voltage). In one configuration, a built in self test is customized to detect weak bit cells. In this configuration, screen margins that are dependent on an operation voltage are not violated. That is, the operation voltage of the customized built in self test may be less than the operating voltage used by conventional tests.

Furthermore, a counter value may be used for back to back reads. A test time may increase as the counter value increases. The customized built in self test may mitigate over testing a device. In one configuration, a test time for the customized built in self test is within a limit of production flow. For example, a test time may be approximately 200 ms. Additionally, in one configuration, the customized built in self test is hardcoded (e.g., embedded) into the memory of a value tier device (e.g., automotive chip). The embedded tests may be triggered throughout the life cycle of the memory to detect aging related defects.

Customizing the built in self test to detect random telegraph noise defects decreases test time and increases detection accuracy. According to aspects of the present disclosure, embedded leakage tests (e.g., built in self tests) may trigger random telegraph noise and detect weak bit cell failure. In one configuration, the customized built in self test uses three instructions to detect (e.g., trigger) a weak bit cell failure. The three instructions may be (R0W1)B, (R0Rx), and (R1W0)B.

Figure 2:
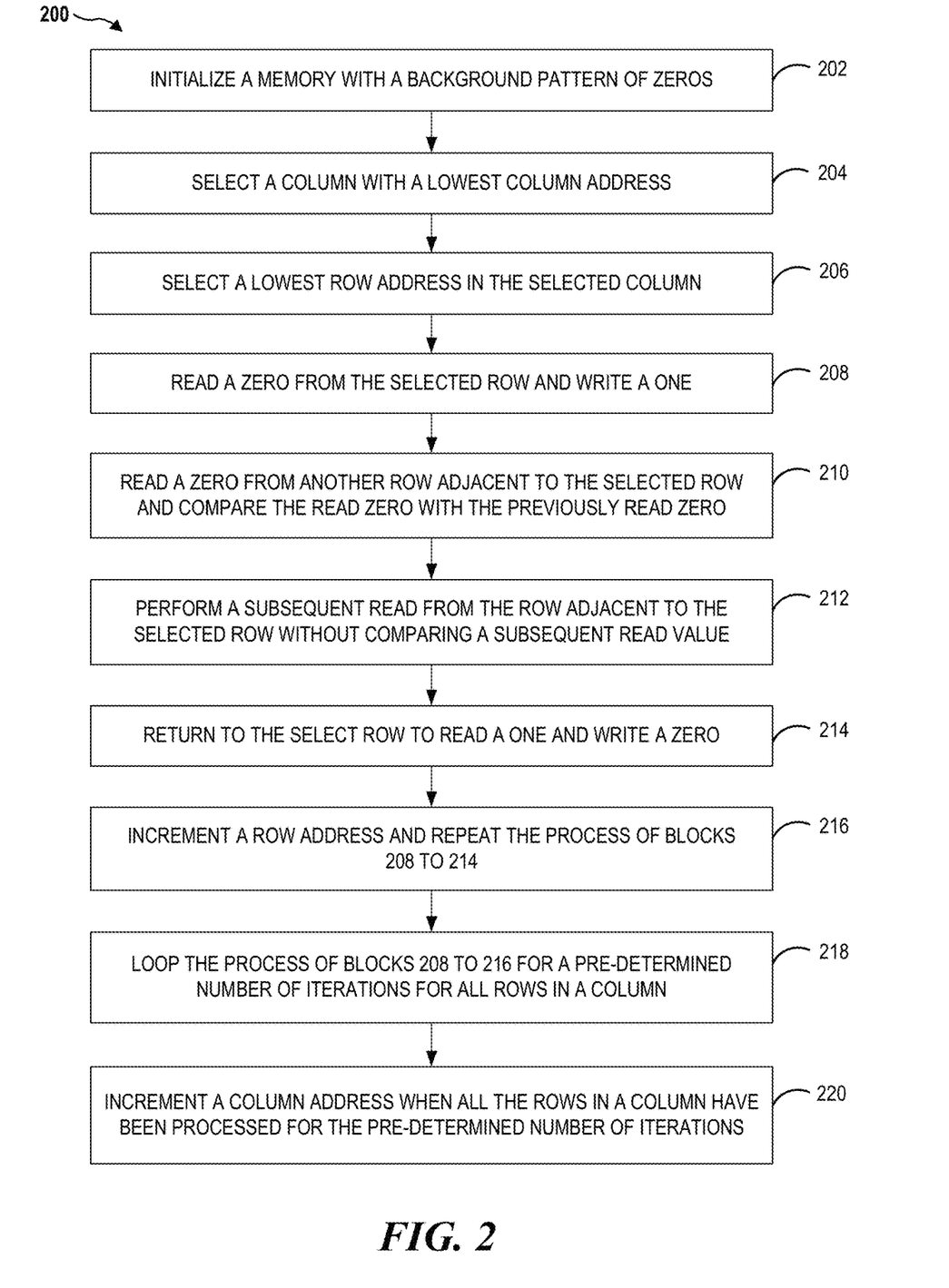
FIG. 2 illustrates a flow diagram of a customized built in self test for detecting random telegraph noise defects according to aspects of the present disclosure.

FIG. 2 illustrates an example of a flow diagram 200 of a customized built in self test for detecting random telegraph noise defects according to aspects of the present disclosure. As shown in FIG. 2, at block 202, the customized built in self test initializes a memory (e.g., bit cells) with a background pattern of zeros. At block 204, a column with a lowest column address is selected. After selecting the column, the customized built in self test selects a lowest row address in the selected column (block 206). At block 208, the customized built in self test reads a zero from the selected row and writes a one to the selected row (e.g., (R0W1)B).

While maintaining the column address, at block 210, the customized built in self test reads a value (e.g., zero) from another row adjacent to the selected row. The read value is compared to zero. The comparison determines whether the initial background write of zero was properly performed. At block 212, another read is performed from the row adjacent to the selected row without comparing a subsequent read value (e.g., (R0Rx)). That is, the built in self test performs back to back reads at blocks 210 and 212. The adjacent row may be in an adjacent row in the same column or an adjacent row in an adjacent column.

At block 214, the customized built in self test returns to the selected row to read a one and write a zero (e.g., (R1W0)B). In one configuration, a failed read is indicative of a defective bit cell. At block 216, the customized built in self test increments a row address and repeats the process of blocks 208 to 214 (e.g., (R0W1)B(R0Rx) (R1W0)B) for the bit cell corresponding to the incremented row address. At block 218, the customized built in self test loops the process of blocks 208 to 216 for a pre-determined number of iterations for each bit cell in a column before incrementing the column address. That is, each bit cell is processed N times before incrementing the row value to move to the next row. In another configuration, after processing a bit cell, the row value is incremented to move to the next row in a column until the entire column is processed. In this configuration, a full pass through each bit cell of a column is processed N times before moving to the next column.

At block 220, the customized built in self test increments a column address once all the rows in a column have been processed for the pre-determined number of iterations. The process of blocks 208 to 218 is repeated for the rows of the column corresponding to the incremented column address. The process continues until the rows in each column have been tested. Although described as moving row by row within a column, the present disclosure also contemplates moving column by column with a row, as an alternative.

Figure 3:
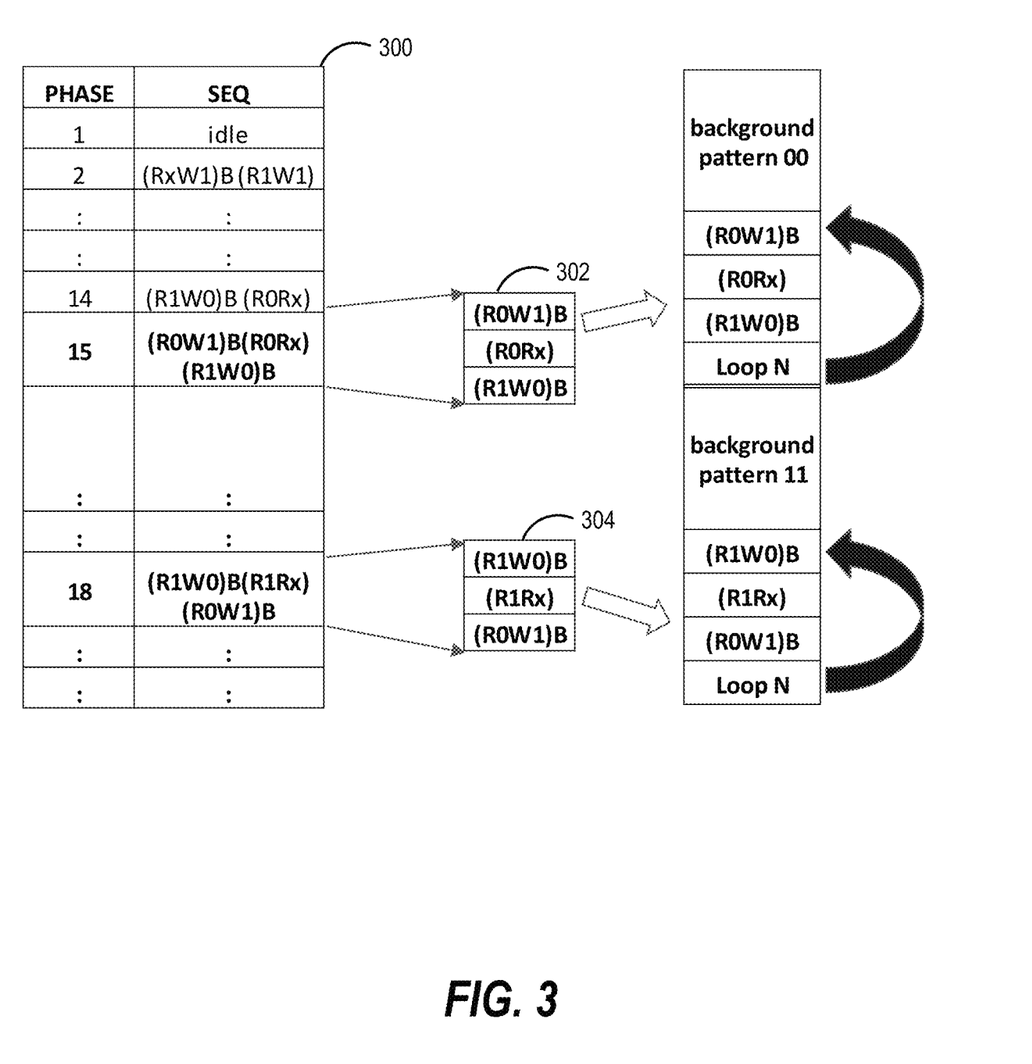
FIG. 3 illustrates a diagram of a customized built in self test sequence according to aspects of the present disclosure.

FIG. 3 illustrates an example of a customized built in self test sequence 300 according to aspects of the present disclosure. As shown in FIG. 3, the customized built in self test sequence 300 may include various testing sequences that correspond to phases of the customized built in self test sequence 300. Conventional built in self test sequences may not detect random telegraph noise defects. Aspects of the present disclosure customize the built in self test sequence 300 to include two testing sequences 302, 304 (e.g., (R0W1)B (R0Rx) (R1W0)B and (R1W0)B (R1Rx) (R0W1)B) to improve the detection of random telegraph noise defects. The built in self test sequence 300 may be embedded in a memory.

As shown in FIG. 3, upon reaching a first phase corresponding to a first testing sequence 302, the customized built in self test initializes the bit cells to the background pattern of zeros (e.g., 00). The testing sequence then reads a zero from a first bit cell of the selected column and writes a one to the first bit cell (e.g., (R0W1)B). In one configuration, the first bit cell corresponds to a lowest addressed row of a lowest addressed column. The customized built in self test then performs back to back read operations (e.g., (R0Rx)) on a second bit cell that is adjacent to the first bit cell. The back to back read operation may include reading a zero from the second bit cell, comparing the read zero, and performing a dummy read from the second bit cell. A dummy read refers to a read without a compare. The first read of the back to back read operations may be performed while shadow write is on. A shadow write may be performed when a write is allowed but an actual write operation is not performed.

After the back to back read operations, the customized built in self test attempts to read a one from the first bit cell. A zero is written back to the first bit cell after attempting to read the one (e.g., (R1W0)B). The first bit cell may be defective if the one is not read from the first bit cell. After testing the first bit cell, the customized built in self test increments a row address and tests a third bit cell corresponding to the incremented row address. In some cases, the third bit cell may be the same as the second bit cell corresponding to the back to back read. The testing continues for all of the bit cells (e.g., rows) in the column. The testing sequence (e.g., (R0W1)B (R0Rx) (R1W0)B) may be repeated for a pre-determined number of iterations on the bit cells in a column before moving to the next phase.

After performing the first testing sequence for all bit cells in a column, the process continue until a second phase corresponding to the second testing sequence 304 is reached. The second testing sequence 304 may be initialized (e.g., (R1W0)B (R1Rx) (R0W1)B)) and the customized built in self test writes ones (e.g., 11) as a background pattern for all of the bit cells of the column. The second background pattern is used to improve detection of a leakage path. For example, the leakage path may be due to a zero to one transition, or vice versa. Therefore, setting a background pattern of zeroes and also a background pattern of ones improves detection of the leakage path.

After setting the background pattern, the customized built in self test reads a one from the first bit cell of the selected column and writes a zero to the first cell (e.g., (R1W0)B. The customized built in self test then performs back to back read operations (e.g., (R1Rx)) on a second bit cell that is adjacent to the first bit cell. The back to back read operations may include reading a one from the second bit cell, comparing the read one, and subsequently performing a dummy read from the second bit cell. The first read of the back to back read operations may be performed while shadow write is on.

After the back to back read operations, the customized built in self test attempts to read a zero from the first bit cell. A one is written back to the first bit cell after attempting to read the zero (e.g., (R0W1)B). The first bit cell may be defective if the zero is not read from the first bit cell. The testing sequence (e.g., (R1W0)B (R1Rx) (R0W1)B) may be repeated for a pre-determined number of iterations for all of the bit cells in a column before moving to the next phase. After completing the testing sequences for the bit cells in a column, the customized built in self test increments a column address and repeats the testing for the bit cells in the subsequent column. The testing continues until all of the bit cells have been tested.

According to aspects of the present disclosure, the first and second testing sequences perform N*2 back to back read operations, which improves the detection of weak memory cells, where N is the pre-determined number of iterations. N may be limited based on the size (e.g., number of bits) of a counter.

In one configuration, the back to back read operations stress the bit cells to provide a leakage path. That is, random telegraph noise affects the read stability of a bit cell. If a bit cell is weak, additional reads may cause a read stability failure. Each read performed at a bit cell increases a cycle count. Therefore, the read stability failure may be detected over time, during the life of the cell, as the cycle count increases with each read performed at the bit cell. Still, as previously discussed, it is desirable to detect a read stability failure of a value tier device, such as a memory of an automobile, prior to in-field operation. Aspects of the present disclosure mimic the degradation of a bit cell by looping back to back read operations to increase the cycle count of a bit cell. The customized built in self test may detect a read stability failure, prior to in-field operation, due to the increased cycle count.

Figure 4:
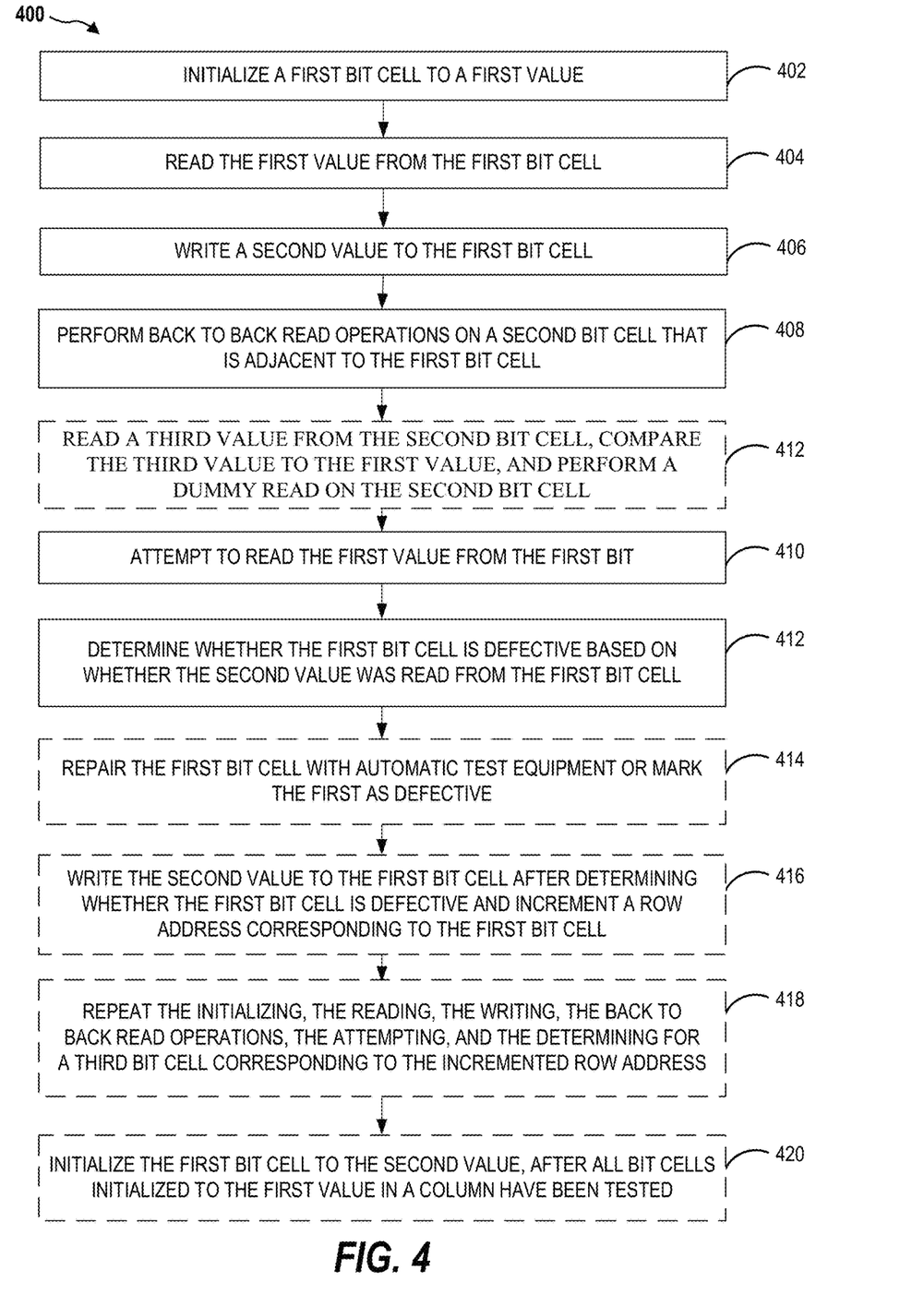
FIG. 4 illustrates a flow diagram of a method for detecting random telegraph noise defects according to aspects of the present disclosure.

FIG. 4 illustrates a flow diagram 400 for detecting random telegraph noise defects in a memory according to aspects of the present disclosure. In one configuration, at block 402, a customized built in self test initializes a first bit cell to a first value. In one configuration, the first bit cell and other bit cells in a column are initialized to the first value. At block 404, after initializing a first bit cell to a first value, the customized built in self test reads the first value from the first bit cell. Additionally, at block 406, the customized built in self test writes a second value to the first bit cell.

At block 408, the customized built in self test performs back to back read operations on a second bit cell that is adjacent to the first bit cell. The second bit cell that is adjacent to the first bit cell may be in a different row of a same column as the first bit cell or in a different column of a same row as the first bit cell. In an optional configuration, at block 410, the back to back read operations include reading a third value from the second bit cell, comparing the read third value to the first value, and performing a dummy read on the second bit cell. Based on the initialization to the first value, the third value should be the same as the first value. The back to back read operations may be performed after writing the second value to the first bit cell. At block 412, the customized built in self test attempts to read the second value from the first bit cell. At block 414, the customized built in self test determines whether the first bit cell is defective based on whether the second value was read from the first bit cell.

In one optional configuration, at block 416, if it is determined that the first bit cell is defective, the customized built in self test repairs the first bit cell with automatic test equipment or marks the first bit cell as defective. A marked bit cell may be excluded from further use by a device. In an optional configuration, at block 418, the customized built in self test writes the first value to the first bit cell after determining whether the first bit cell is defective. At block 418, the customized built in self test writes also increments a row address corresponding to the first bit cell. Furthermore, in another optional configuration, at block 420, the customized built in self test repeats the initializing, the reading, the writing, the back to back read operations, the attempting, and the determining for a third bit cell corresponding to the incremented row address.

In one configuration, the initializing, the reading, the writing, the back to back read operations, the attempting, and the determining are performed for all bit cells in a column for a pre-determined number of iterations. In an optional configuration, at block 422, the customized built in self test initializes the first bit cell to the second value, after all bit cells initialized to the first value in a column have been tested. The bit cells in a column initialized to the second value are tested for the pre-determined number of iterations. A column address may be incremented after all of the bit cells in a column have been initialized to the first value and the second value and tested with each initialized value for the pre-determined number of iterations. The testing is then repeated for the bit cells of the column corresponding to the incremented column address. The testing may continue until all of the bit cells of the memory have been initialized to the first value and the second value and tested with each initialized value for the pre-determined number of iterations.

Figure 5:
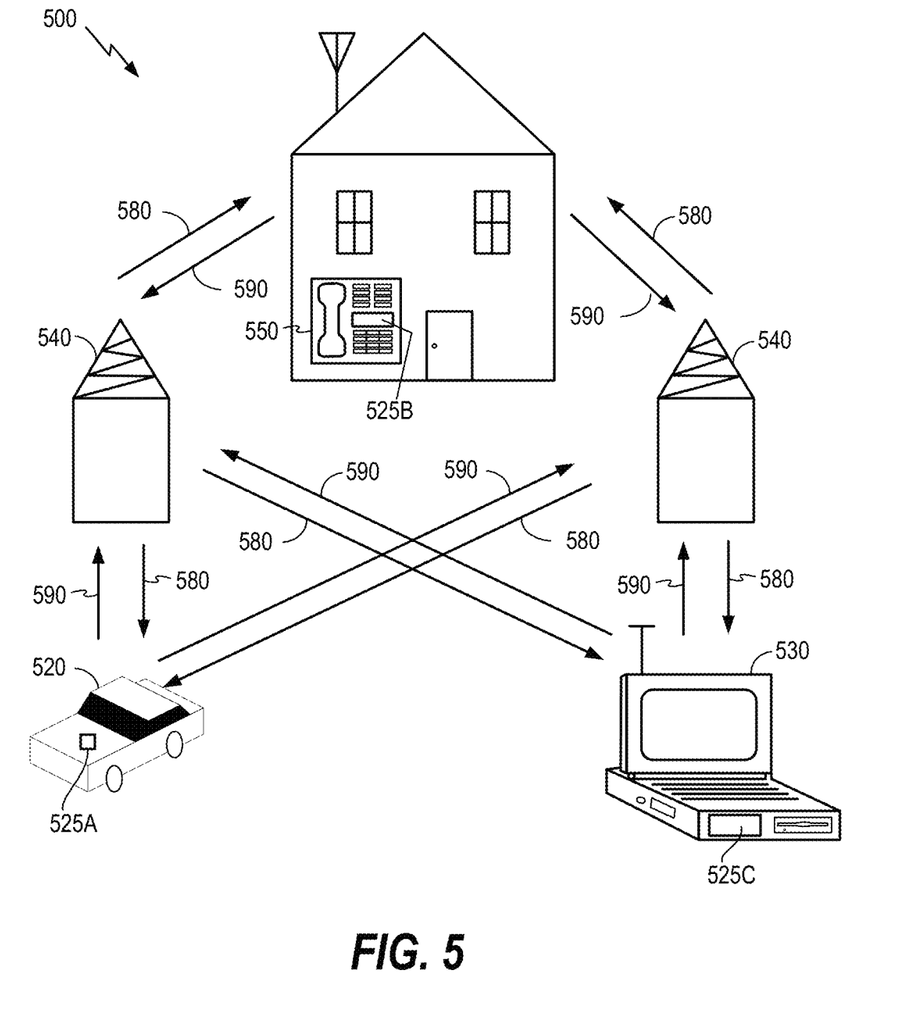
FIG. 5 illustrates a block diagram showing an exemplary wireless communication system in which a configuration of the present disclosure may be advantageously employed.

FIG. 5 is a block diagram showing an exemplary wireless communication system 500 in which an aspect of the present disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include memory devices with customized built in self tests according to aspects of the present disclosure. It will be recognized that other devices may also include the disclosed memory devices with customized built in self tests, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as an automobile, remote unit 530 is shown as a portable computer, and remote unit 550 is shown as a fixed location remote unit in a wireless local loop system. For example, the remote units may be a mobile phone, a hand-held personal communication systems (PCS) unit, a portable data unit such as personal digital assistant (PDA), a GPS enabled device, a navigation device, a set top box, a music player, a video player, an entertainment unit, a fixed location data unit such as a meter reading equipment, or a communications device that stores or retrieves data or computer instructions, or combinations thereof. Although FIG. 5 illustrates remote units according to the aspects of the present disclosure, the present disclosure is not limited to these exemplary illustrated units. Aspects of the present disclosure may be suitably employed in many devices, which include the disclosed memory devices with customized built in self tests.

According to a further aspect of the present disclosure, an apparatus for detecting random telegraph noise defects in a memory is described. The apparatus may include means for initializing a first bit cell of the memory to a first value, means for reading the first value from the first bit cell, means for writing a second value to the first bit cell, means for performing back to back read operations on a second bit cell adjacent to the first bit cell, means for attempting to read the second value from the first bit cell, and/or means for determining whether the first bit cell is defective based on whether the second value was read from the first bit cell. The initializing means, reading means, writing means, performing means, attempting means, and/or determining means may be an IC device 525A, 525C, 525B and/or a memory device. In another aspect, the aforementioned means may be any module or apparatus configured to perform the functions recited by the aforementioned means.

The various illustrative logical blocks, modules, and circuits described in connection with the present disclosure may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of detecting random telegraph noise defects in a memory, comprising:
    initializing a first bit cell of the memory to a first value;
    reading the first value from the first bit cell;
    writing a second value to the first bit cell;
    performing back to back read operations on a second bit cell adjacent to the first bit cell, after writing the second value;
    attempting to read the second value from the first bit cell; and
    determining whether the first bit cell is defective based on whether the second value was read from the first bit cell.

2. The method of claim 1, further comprising:
    writing the first value to the first bit cell after determining whether the first bit cell is defective; and
    incrementing a row address corresponding to the first bit cell.

3. The method of claim 2, further comprising repeating the initializing, the reading, the writing, the back to back read operations, the attempting, and the determining for a third bit cell corresponding to the incremented row address.

4. The method of claim 1, further comprising initializing the first bit cell to the second value, after all bit cells initialized to the first value in a column have been tested.

5. The method of claim 1, in which the second bit cell adjacent to the first bit cell is in a different row of a same column as the first bit cell or in a different column of a same row as the first bit cell.

6. The method of claim 1, further comprising repairing the first bit cell or marking the first bit cell as defective when determining the first bit cell is defective.

7. The method of claim 1, in which performing the back to back read operations comprises:
    reading a third value from the second bit cell;
    comparing the third value to the first value; and
    performing a dummy read from the second bit cell after comparing the third value to the first value.

8. An apparatus for detecting random telegraph noise defects in a memory, the apparatus comprising:
    the memory; and
    at least one processor coupled to the memory, the at least one processor configured:
        to initialize a first bit cell of the memory to a first value;
        to read the first value from the first bit cell;
        to write a second value to the first bit cell;
        to perform back to back read operations on a second bit cell adjacent to the first bit cell, after writing the second value;
        to attempt to read the second value from the first bit cell; and
        to determine whether the first bit cell is defective based on whether the second value was read from the first bit cell.

9. The apparatus of claim 8, in which the at least one processor is further configured:
    to write the first value to the first bit cell after determining whether the first bit cell is defective; and
    to increment a row address corresponding to the first bit cell.

10. The apparatus of claim 9, in which the at least one processor is further configured to repeat the initializing, the reading, the writing, the back to back read operations, the attempting, and the determining for a third bit cell corresponding to the incremented row address.

11. The apparatus of claim 8, in which the at least one processor is further configured to initialize the first bit cell to the second value, after all bit cells initialized to the first value in a column have been tested.

12. The apparatus of claim 8, in which the second bit cell adjacent to the first bit cell is in a different row of a same column as the first bit cell or in a different column of a same row as the first bit cell.

13. The apparatus of claim 8, in which the at least one processor is further configured to repair the first bit cell or mark the first bit cell as defective when determining the first bit cell is defective.

14. The apparatus of claim 8, in which the at least one processor is further configured:
    to read a third value from the second bit cell;
    to compare the third value to the first value; and
    to perform a dummy read from the second bit cell after comparing the third value to the first value.

15. A non-transitory computer-readable medium having program code recorded thereon for detecting random telegraph noise defects in a memory, the program code executed by a processor and comprising:
    program code to initialize a first bit cell of the memory to a first value;
    program code to read the first value from the first bit cell;
    program code to write a second value to the first bit cell;
    program code to perform back to back read operations on a second bit cell adjacent to the first bit cell, after writing the second value;
    program code to attempt to read the second value from the first bit cell; and
    program code to determine whether the first bit cell is defective based on whether the second value was read from the first bit cell.

16. The non-transitory computer-readable medium of claim 15, in which the program code further comprises:
    program code to write the first value to the first bit cell after determining whether the first bit cell is defective; and
    program code to increment a row address corresponding to the first bit cell.

17. The non-transitory computer-readable medium of claim 16, in which the program code further comprises program code to repeat the program code to initialize, the program code to read, the program code to write, the program code to perform back to back read operations, the program code to attempt, and the program code to determine for a third bit cell corresponding to the incremented row address.

18. The non-transitory computer-readable medium of claim 15, in which the program code further comprises program code to initialize the first bit cell to the second value, after all bit cells initialized to the first value in a column have been tested.

19. The non-transitory computer-readable medium of claim 15, in which the second bit cell adjacent to the first bit cell is in a different row of a same column as the first bit cell or in a different column of a same row as the first bit cell.

20. The non-transitory computer-readable medium of claim 15, in which the program code further comprises program code to repair the first bit cell or mark the first bit cell as defective when determining the first bit cell is defective.

21. The non-transitory computer-readable medium of claim 15, in which the program code to perform back to back read operations comprises:
   program code to read a third value from the second bit cell;
   program code to compare the third value to the first value; and
   program code to perform a dummy read from the second bit cell after comparing the third value to the first value.

* * * * *